(12) United States Patent
Khandekar et al.

(10) Patent No.: US 7,943,463 B2
(45) Date of Patent: May 17, 2011

(54) METHODS OF SEMICONDUCTOR PROCESSING INVOLVING FORMING DOPED POLYSILICON ON UNDOPED POLYSILICON

(75) Inventors: Anish Khandekar, Boise, ID (US); Ervin T. Hill, Boise, ID (US); Jixin Yu, Boise, ID (US); Jeffrey B. Hull, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 115 days.

(21) Appl. No.: 12/417,038

(22) Filed: Apr. 2, 2009

(65) Prior Publication Data

US 2010/0255664 A1 Oct. 7, 2010

(51) Int. Cl.
*H01L 21/336* (2006.01)

(52) U.S. Cl. .. 438/259; 438/488; 438/589; 257/E21.428

(58) Field of Classification Search ........... 438/488, 438/589, 592, 259, 270; 257/E21.428
See application file for complete search history.

(56) References Cited

U.S. PATENT DOCUMENTS

| | | |
|---|---|---|
| 4,332,076 A | 6/1982 | Solo de Zalivar |
| 4,502,202 A | 3/1985 | Malhi |
| 4,656,497 A | 4/1987 | Rogers et al. |
| 5,189,504 A | 2/1993 | Nakayama et al. |
| 5,192,708 A | 3/1993 | Beyer et al. |
| 5,830,797 A | 11/1998 | Cleeves |
| 6,359,300 B1 | 3/2002 | Economikos et al. |
| 6,689,668 B1 | 2/2004 | el-Hamdi et al. |
| 6,815,077 B1* | 11/2004 | Herner et al. ............ 428/450 |
| 6,833,311 B2 | 12/2004 | Ho et al. |
| 6,943,089 B2* | 9/2005 | Takasawa et al. ......... 438/381 |
| 6,974,749 B2 | 12/2005 | Lai et al. |
| 6,991,985 B2 | 1/2006 | Dong et al. |
| 7,012,009 B2 | 3/2006 | Lee et al. |
| 7,019,360 B2 | 3/2006 | Blanchard et al. |
| 7,109,097 B2* | 9/2006 | Paranjpe et al. .......... 438/510 |
| 7,354,848 B2* | 4/2008 | Paranjpe et al. .......... 438/592 |
| 7,364,980 B2 | 4/2008 | Nogami et al. |
| 7,625,796 B2* | 12/2009 | Fumitake ................. 438/257 |
| 2005/0017066 A1 | 1/2005 | Carter |
| 2005/0023926 A1 | 2/2005 | Aulanko et al. |
| 2006/0001052 A1* | 1/2006 | Ping et al. ................ 257/213 |
| 2008/0268588 A1* | 10/2008 | Anderson et al. ......... 438/218 |

OTHER PUBLICATIONS

Van Zant, Peter, "Microchip Fabrication", Third Edition, pp. 372-381, (1997).

* cited by examiner

*Primary Examiner* — Micheal Trinh
(74) *Attorney, Agent, or Firm* — Brooks, Cameron & Huebsch, PLLC (57) ABSTRACT

A number of methods are provided for semiconductor processing. One such method includes depositing a first precursor material on a surface at a particular temperature to form an undoped polysilicon. The method also includes depositing a second precursor material on a surface of the undoped polysilicon at substantially the same temperature, wherein the undoped polysilicon serves as a seed to accelerate forming a doped polysilicon.

18 Claims, 7 Drawing Sheets

METHODS OF SEMICONDUCTOR PROCESSING INVOLVING FORMING DOPED POLYSILICON ON UNDOPED POLYSILICON

TECHNICAL FIELD

The present disclosure relates to the field of semiconductors and, in particular, to an improved method of semiconductor processing.

BACKGROUND

In modern electronic devices, increasing numbers of components may be packed into a single small area, for instance, to create a memory cell array. For such a device to function, many of the individual components may need to be electrically isolated from one another. Accordingly, electrical isolation is important for preventing unwanted electrical interaction between adjacent components.

Structures (e.g., trenches) may be formed during fabrication of electronic devices to, for instance, isolate areas in which active components, for instance, transistors, memory cells, and the like, are formed. As the size of electronic components has become smaller than 250 nanometers, using trench structures has become preferable to, for instance, isolation using local oxidation of silicon. In some instances, a layer (e.g., a film) of semiconductor material may be deposited on the surface of electronic components and an unfilled portion of one or more trenches to serve, for instance, as a control gate.

However, when electronic components reach the size of 100 nanometers or less, a width of a trench may be narrow enough to make uniform deposition of a semiconductor layer thereon unreliable. In some instances, the uniformity of the deposition may become compromised enough to leave empty bubbles, or other voids, within the trench. Such voids may contribute to unwanted interactions between the adjacent components.

DETAILED DESCRIPTION OF THE DISCLOSURE

A number of methods are provided for semiconductor processing. One such method includes depositing a first precursor material on a surface (e.g., of a semiconductor structure) at a particular temperature (e.g., 380-450 degrees Celsius (° C.)) to form an undoped polysilicon. The method also includes depositing a second precursor material on a surface of the undoped polysilicon at substantially the same temperature. The undoped polysilicon can, for example, serve as a seed to contribute to and/or accelerate forming a doped polysilicon. Forming the doped polysilicon can be contributed to and/or accelerated, for example, by improving uniformity of and/or decreasing an incubation time for doped polysilicon nucleation at the particular temperature, which can be lower than an otherwise suitable temperature (e.g., 550-650° C.) for deposition of the doped polysilicon.

Silane ($SiH_4$) is a known precursor material used for deposition of a silicon (Si) layer in a chemical vapor deposition (CVD) reactor. Silane offers an advantage, for instance, when compared to silicon tetrachloride ($SiCl_4$) combined with hydrogen ($H_2$), in not requiring a second reaction gas. That is, silane may be directly converted into silicon atoms by decomposing when exposed to a sufficiently elevated temperature.

In semiconductor processing, an "epitaxial" layer generally refers to a single crystalline layer deposited on a single crystalline surface. Such a layer may occur when silicon atoms are deposited on an undoped (e.g., pure) single crystalline silicon surface, for instance, in a CVD reactor. Under suitable conditions, the silicon atoms may be deposited on the undoped silicon surface with sufficient energy to rearrange themselves on the surface and to orient into the single crystalline arrangement of the silicon atoms of the surface upon which they have been deposited. In contrast, when the surface upon which the silicon atoms are to be deposited consists of a non-single crystalline configuration, for instance, silicon dioxide ($SiO_2$) being in a metastable liquid phase (e.g., glass), the deposited silicon atoms may have no corresponding underlying structure with which to align and a resulting configuration may be termed "polysilicon", as utilized in the present disclosure.

The configuration of polysilicon has been previously described as a total non-arrangement of silicon atoms (e.g., as being "amorphous"). However, in the context of deposited polysilicon, the configuration can differ. During an early stage of deposition at a low temperature (e.g., below 550° C.) the configuration of a polysilicon layer, for instance, adjacent a substrate having a non-single crystalline configuration, may begin with an amorphous configuration. During further deposition at temperatures below 550° C., a polysilicon layer formed by, for instance, deposition of a silane precursor (e.g., a silane-deposited layer) may consist of forming nanocrystalline, microcrystalline and/or polycrystalline small pockets. Such deposition may be a randomly arranged (e.g., amorphous) deposition of such crystallites and/or grains of single-crystalline silicon separated by grain boundaries.

A resulting final configuration of such a deposited layer may depend upon a blend of deposition temperatures, process pressures, gas flow rates, precursor and/or dopant types, among other operating parameters of a CVD reactor. As such, the final configuration may range from being purely amorphous, nanocrystalline, microcrystalline or polycrystalline to being mixtures thereof, and the arrangement of the single-crystalline silicon crystallites and/or grains may be amorphous. The combined effects of a CVD reactor's operating parameters also may affect the deposition rate and/or the crystallite and/or grain size. Accordingly, the configuration a polysilicon layer, as utilized in the present disclosure, can be referred to as being in a substantially amorphous configuration.

Depositing silicon atoms on a surface of a crystalline substrate of differing chemical composition or a non-crystalline substrate (e.g., amorphous $SiO_2$) may inhibit orientation of the silicon atoms. Deposition on such a substrate may be termed heterogeneous deposition. Inhibiting orientation of the deposited silicon atoms may consequently delay the formation of nucleation sites on the surface of such a heterogeneous substrate, which also may delay formation of a continuous polysilicon layer on the heterogeneous substrate. Further, delaying the formation of nucleation sites may result in the formation of multiple nucleation sites to be spread out over a relatively long time period, which may negatively affect uniformity in thickness of the eventually deposited polysilicon layer. In some instance, a particular choice of dopant may further contribute to the delay of nucleation.

Temperature is an important parameter in polysilicon layer deposition. An ambient temperature in an isothermal chamber of a CVD reactor (e.g., in a quartz tube enclosed batch chamber) may bring a number of semiconductor substrates, components thereon, and/or gaseous precursor materials, among other contents of such a chamber, to a substantially uniform temperature via thermal equilibrium. Such a temperature may be determined and/or affected via a feedback mechanism using a thermocouple that measures the ambient temperature in the vicinity of, for instance, the number of semiconductor substrates and components thereon.

Higher temperatures may increase a growth rate of a deposited layer and/or change the deposition mode from amorphous to nanocrystalline to microcrystalline to polycrystalline. However, faster growth rates due to higher temperatures may also increase an occurrence of rough layer surfaces, formation of grain boundaries, crystal defects, film cracking, stress, autodoping, and out-diffusion, and the like. Silane may undergo rapid decomposition in a temperature range above 550 degrees ° C. Use of boron doping (e.g., with $BCl_3$ precursor gas) may reduce the temperature range for rapid decomposition to below 450° C. Silane also is used to fill trenches in semiconductor processing, even on an amorphous $SiO_2$ substrate.

However, temperatures that allow a high growth rate for polysilicon on $SiO_2$ may promote the just-mentioned undesired effects, while lowering the temperature may promote a delayed and spread out range of nucleation times leading to non-uniform deposition of the silane onto the polysilicon layer. Especially in the narrow trenches (e.g. 20-30 nanometers (nm) wide) used for electronic components of 100 nm or less, lack of uniformity in deposition thickness may contribute to formation of voids within the trench. Such voids may contribute to unwanted interactions between the adjacent components, for instance, current leakage, coupling, latch-up, noise margin degradation, voltage shift, and crosstalk, and the like.

The presence of dopants in the gas stream also may affect the deposition rate and/or grain size. In situ doping may be performed by adding one or more gas dopant sources and metering introduction of the gas dopant into a reaction chamber. Using certain parameter settings (e.g., a sufficiently elevated temperature), adding a source of, for instance, boron (B) in the dopant gas (e.g., boron trichloride ($BCl_3$), diborane ($B_2H_6$), and the like) may increase the deposition rate. In contrast, adding a source of phosphorus (P) in the dopant gas (e.g., phosphine ($PH_3$), and the like) may decrease the deposition rate. Undesirable effects of in situ doping may include loss of uniformity in thickness of the layer being deposited, lack of control over the deposition rate, doping non-uniformity, and the like. Such undesirable effects may be exacerbated by using low temperatures in the CVD reactor and/or when depositing a doped precursor material (e.g., a mixture of silane and boron-containing gases) to fill narrow trenches with a doped polysilicon layer.

Polysilicon layers, as described herein, may be deposited using low pressure CVD (LPCVD) reactors that also may use relatively low deposition temperatures. LPCVD may provide an advantage in "step coverage" (e.g., the ratio of thickness of film along the walls or edge of a step to the thickness of the film at the bottom of a step) in that polysilicon layers may be deposited late in semiconductor processing when an exposed surface exhibits a variable topography. Single chamber LPCVD reactors may offer an advantage in processing time and reliability when utilized in semiconductor processing that involves a plurality of precursor gas depositions, in particular, when such depositions can be performed at substantially the same low temperature.

Figure 1:
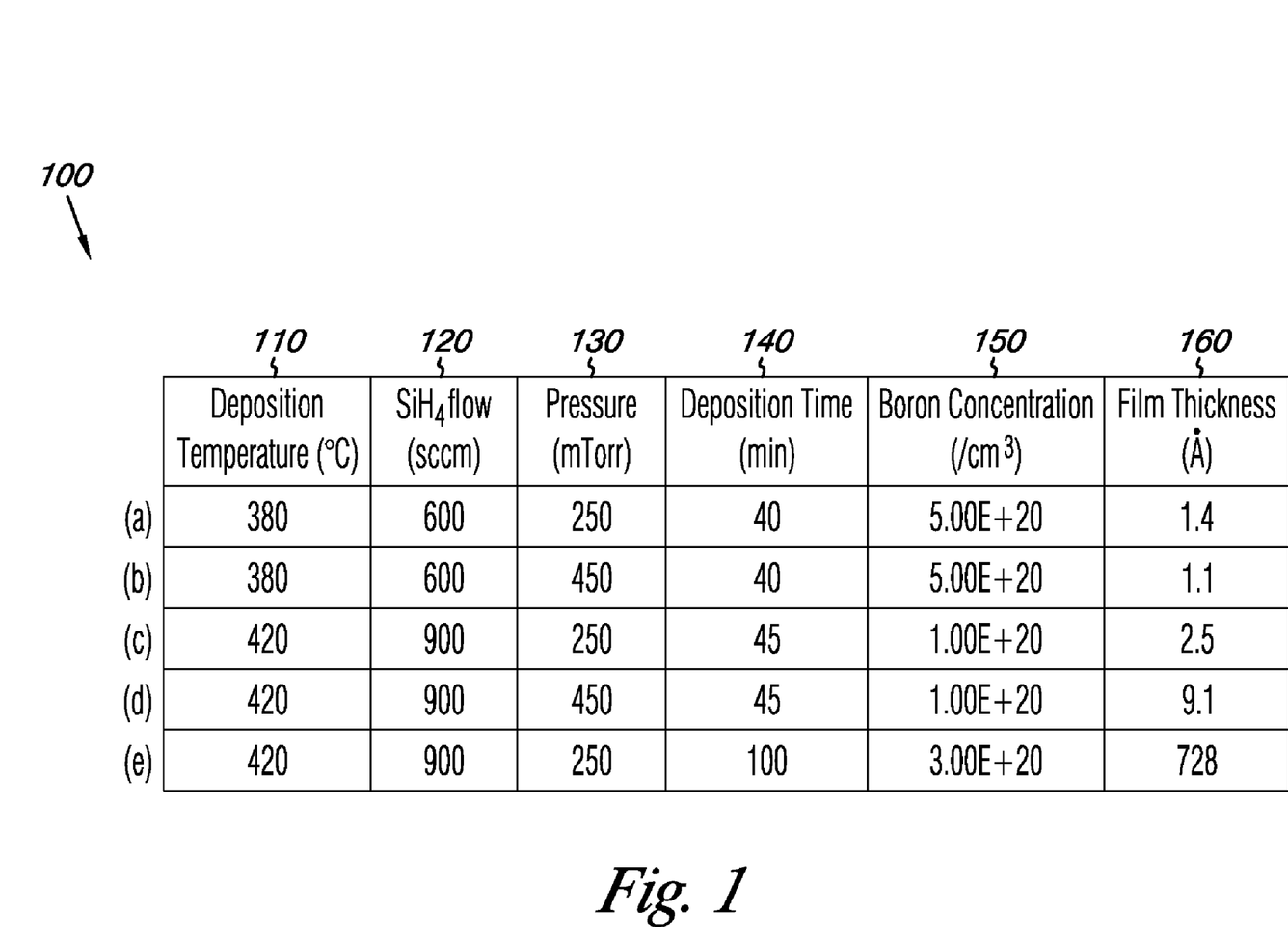
FIG. 1 is a table illustrating representative results for depositing polysilicon using a boron-doped silane-deposited layer on a silicon dioxide surface.

FIG. 1 is a table illustrating representative results for depositing polysilicon using a boron-doped silane-deposited layer on a silicon dioxide surface. A table 100 illustrated in FIG. 1 shows a number of operating parameters for a CVD reactor (e.g., a LPCVD as described herein) that may affect the time taken for nucleation of boron-doped (B-doped) silane to begin (i.e., the nucleation time) on a flat, undoped, amorphous $SiO_2$ surface and/or the subsequent rate of formation of the B-doped polysilicon layer thereon. Such a $SiO_2$ surface can be used to mimic a $SiO_2$ layer present in a trench in a semiconductor structure.

As shown in the upper row of the table 100, the operating parameters can include a deposition temperature 110, as measured in ° C., a silane ($SiH_4$) flow rate 120, as measured in standard cubic centimeters per minute (sccm), a gas pressure 130, as measured in milliTorr (mTorr), a deposition time 140 allowed, measured in minutes (min), and a boron concentration 150, measured as a number of dopant boron atoms present per cubic centimeter ($/cm^3$) of the deposited polysilicon, which can be determined by a concentration of boron-containing gas (e.g., $BCl_3$) in the reaction chamber. The number of boron atoms is indicated by an integer times 10 to the $20^{th}$ power (e.g., 5.00 E+20).

Such operating parameters may affect a B-doped polysilicon film thickness 160 measured at a particular deposition time 140, the thickness being measured, in table 100, in Ångströms (Å), which are units of $1.0 \times 10^{-10}$ meters (i.e., 0.1 nm). The descending rows (a) through (e) in table 100 show varying input values in the operating parameters 110, 120, 130, 140, and 150 and how such variables may affect the film thickness 160 of the resulting B-doped polysilicon layer.

In row (a) of table 100, the effect of a 250 mTorr pressure 130 parameter on film thickness 160 is shown, which can be compared to row (b) and the film thickness 160 resulting from raising the pressure 130 to 450 mTorr. The other operating parameters are kept constant, in particular, the deposition temperature 110 at 380° C. and the deposition time at 40 min. The B-doped film thicknesses 160 from both pressures 130 being consistently small (i.e., 1.4 Å versus 1.1 Å) appears to indicate that pressure variation, at least in the range of a LPCVD reactor, has little effect. Additionally, the B-doped film thicknesses being so small after 40 min appears to indicate that nucleation has just begun for the B-doped precursor material around that time on the SiO$_2$ surface. This nucleation time is longer than nucleation times witnessed with B-doped silane-deposited polysilicon when performed at 520° C., which may take less than 1 minute.

Comparing row (a) with row (c) in table 100 shows how raising the deposition temperature 110, the silane flow rate 120, and the deposition time 140 can affect film thickness 160. That is, the deposition temperature 110 has been raised from 380° C. in row (a) to 420° C. in row (c), the silane flow rate 120 has been raised from 600 sccm in row (a) to 900 sccm in row (c), and the deposition time 140 has been raised from 40 min in row (a) to 45 min in row (c). The pressure 130 parameter remains constant between the two rows. Despite the boron concentration 150 being lowered five-fold in row (c) compared to row (a), the film thickness 160 increased to 2.5 Å in row (c) compared to 1.4 Å in row (a). This result appears to indicate that raising deposition temperature, silane flow rate, and/or deposition time by a small length of time may shorten the nucleation time and/or increase the deposition rate. The difference, however, is not notable, as indicated by the film thickness remaining minimal.

Comparing row (c) with row (d) in table 100 shows an effect of raising the pressure 130 on the film thickness 160. That is, the pressure 130 has been raised from 250 mTorr in row (c) to 450 mTorr in row (d). The deposition temperature 110, silane flow 120, deposition time 140, and boron concentration 150 parameters remains constant between the two rows. The film thickness 160 increased from 2.5 Å in row (c) to 9.1 Å in row (d). This result appears to indicate that raising the pressure may shorten the nucleation time and/or increase the deposition rate. The difference is not notable, as indicated by the film thickness remaining small, in particular, as compared to the results shown below for row (e).

The deposition temperature 110, silane flow 120, and pressure 130 operating parameters shown in row (e) of table 100 are consistent with those shown in row (c), although the boron concentration 150 in row (e) is intermediate between those shown in rows (a)-(b) and rows (c)-(d). The notable variance in operating parameters between rows (c) and (e), however, is that the deposition time 140 is shown to be increased from 40 min in row (c) to 100 min in row (e). Of particular note, the significantly extended deposition time has allowed the B-doped polysilicon film thickness 160 to increase from 2.5 Å in row (c) to 728 Å in row (e), an almost 300-fold increase by providing less than an additional hour of deposition time.

The results illustrated in FIG. 1 indicate that an incubation period for initial nucleation of B-doped polysilicon on a SiO$_2$ surface may be almost 40 min because as little as 1.1 Å of B-doped film was seen after 40 min, in some circumstances. Row (e) of table 100 indicates, however, that after 100 min of deposition time the B-doped film thickness can increase to 728 Å, (i.e., 72.8 nm).

Hence, the results shown in table 100 may be indicative of a substantial resistance to nucleation of a B-doped polysilicon film on a SiO$_2$ surface contributing to a lengthy incubation period where there is little or no growth of the B-doped polysilicon film. The results also may indicate that, once a polysilicon seed surface (e.g., a surface upon which multiple seed crystals have been formed by nucleation) has been deposited, additional B-doped polysilicon may be deposited more readily, thereby resulting in an elevated deposition rate. For example, the B-doped polysilicon in rows (a)-(d) has a deposition rate in a range of 0.03-0.20 Å/min. In the additional 55-60 min of deposition time shown in row (e), however, the B-doped polysilicon deposition rate has increased to a range of 12.11-13.19 Å/min, when subtracting the films shown in rows (a)-(d) formed in the first 40-45 min. As such, after the incubation period has elapsed, and nucleation has occurred at multiple sites on the SiO$_2$ surface, the apparent deposition rate of the B-doped polysilicon has increased between 60-fold and 440-fold.

Figure 2:
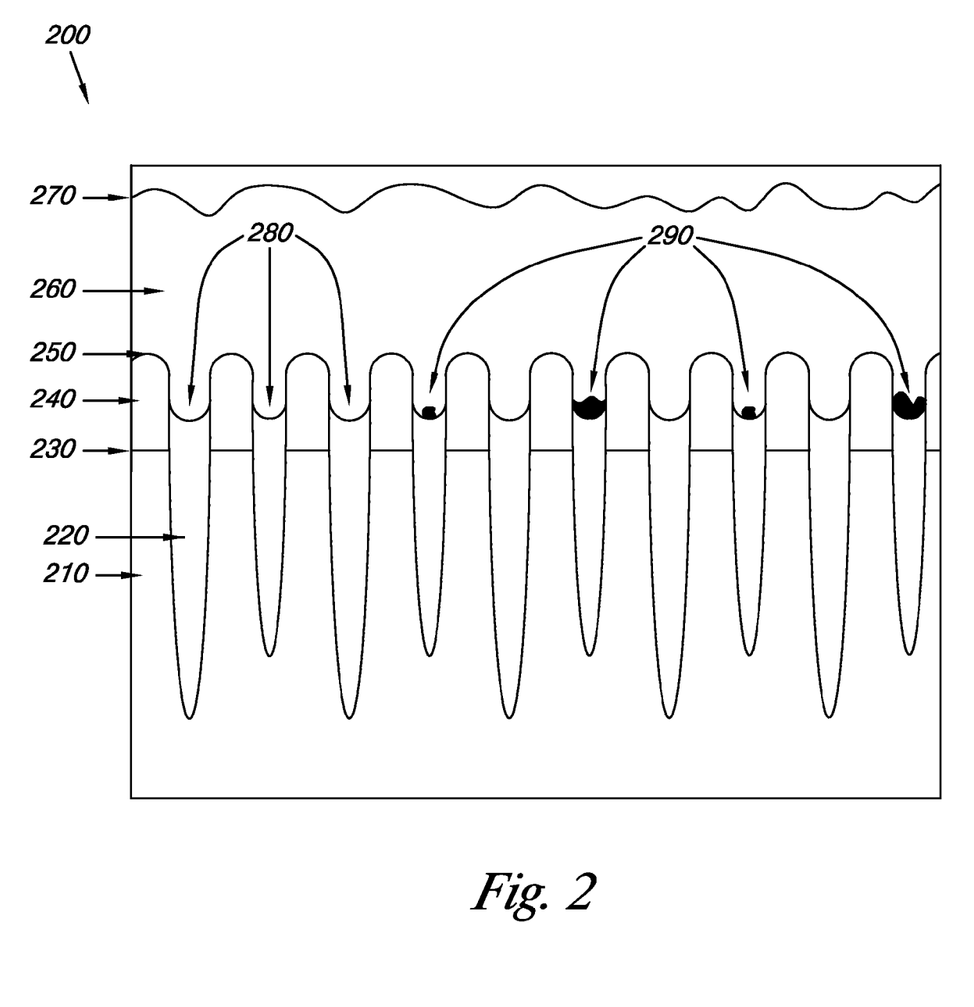
FIG. 2 illustrates a representative cross-sectional view of voids formed in trenches during deposition of polysilicon using a doped polysilicon on a silicon dioxide surface.
Figure 5:
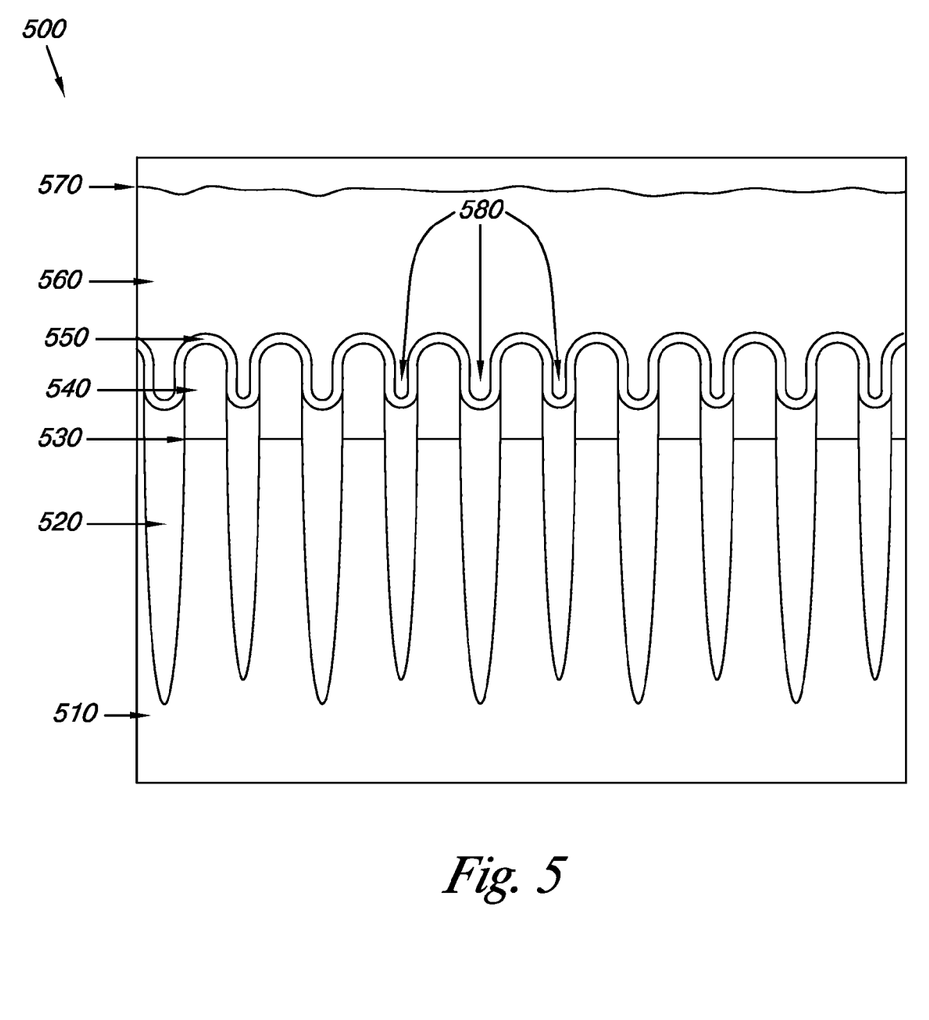
FIG. 5 illustrates a representative cross-sectional view of reduction of void formation in trenches resulting from deposition of polysilicon using a boron-doped silane-deposited layer on an undoped disilane-deposited layer according to one or more embodiments of the present disclosure.

FIG. 2 illustrates a representative cross-sectional view of voids formed in trenches during deposition of polysilicon using a doped polysilicon on a silicon dioxide surface. A structure 200 as illustrated in FIG. 2 can represent a semiconductor structure 200 positioned on a semiconductor substrate 210, which can have a number of materials (e.g., various conductors, semiconductors, dielectrics, among other materials) positioned thereon to form various components (e.g., gates). Such a structure 200 can, for example, include a number of trenches (e.g., at 220) that separate portions of the semiconductor substrate 210 and the components positioned thereon, which can control electrical interaction between the various components associated with the structure 200. FIGS. 2 and 5 each can represent an end view of a cut of a structure such that lengths of the trenches run perpendicular to the plane, as illustrated in FIG. 2.

Details of trench morphology and/or surface topography (e.g., varying heights, depths, peaks, valleys, etc.) can be determined utilizing images obtained with high-definition microscopy. Examples of apparatuses that can be utilized to obtain such high-definition images can, for instance, include scanning electron microscopy (SEM), scanning tunneling microscopy (STM), transmission electron microscopy (TEM), scanning force microscopy (SFM), and/or atomic force microscopy (AFM), among others.

As used herein, the term "semiconductor substrate" is intended to denote any construction having semiconductive material, which, by way of example and not by way of limitation, can include bulk semiconductive materials such as a semiconductive wafer (e.g., alone or in assemblies including other materials thereon), and semiconductive material layers (e.g., alone or in assemblies including other materials). As also used herein, the term "substrate" refers to any supporting structure, which, by way of example and not by way of limitation, can include the semiconductive substrates described in the present disclosure.

In addition, the term "substrate", as used in the present disclosure, can, in some embodiments, include any structure that has an exposed silicon-containing surface. Such structures can include silicon-on insulator (SOI), silicon-on sapphire (SOS), doped and undoped semiconductors, epitaxial layers (e.g., single-crystalline) of silicon-containing compounds and/or polysilicon layers (e.g., amorphous) of silicon-containing compounds supported by a base semiconductor foundation, among other semiconductor structures. In some substrate embodiments, the semiconductor need not be silicon-based. The semiconductor can, in various embodiments, be silicon-germanium, germanium, and/or gallium-arsenide, among other compounds. When reference is made to a substrate herein, previous unspecified process steps may have been utilized to form regions or junctions in the base semiconductor and/or foundation.

Additionally, as used herein, substrate can refer to a semiconductor substrate such as a base semiconductor layer or a semiconductor substrate having one or more layers, structures, or regions formed thereon. A base semiconductor layer may be the underlying layer of silicon and/or silicon-containing material on a wafer or a silicon-containing layer deposited on another material, such as silicon on sapphire or silicon on insulator, among other examples.

"Layer" as used herein can refer to a layer formed on a substrate using a deposition process. The term "layer" is meant to include layers specific to the semiconductor industry, such as "barrier layer," "dielectric layer," and "conductive layer" and the like. The term "layer" is synonymous with the term "film" frequently used in the semiconductor industry and as utilized in the present disclosure. In the context of this document, the term "layer" encompasses both the singular and the plural unless otherwise indicated.

The figures presented herein follow a numbering convention in which the first digit or digits correspond to the drawing figure number and the remaining digits identify an element or component in the drawing. Similar elements or components between different figures may be identified by the use of similar digits. For example, 110 may reference element "10" in FIG. 1, and a similar element may be referenced as 210 in FIG. 2.

The process of adding particular elemental impurities to a semiconductor material is known as doping. The amount of a dopant added to a pure semiconductor material (e.g., single-crystalline silicon) may change its level of conductivity. By adding dopant to pure semiconductors, the electrical conductivity may be varied by the number of dopant atoms and also by the type of dopant atoms. In some instances, the conductivity may be increased in a range of $10^3$-$10^6$-fold. For instance, addition of 0.0001% of arsenic as a dopant to a pure germanium semiconductor material donates around $10^{17}$ free electrons per cubic centimeter (/$cm^3$) and the electrical conductivity may increase about $10^4$-fold.

The element chosen as a suitable dopant depends upon the atomic properties of both the dopant and the material to be doped. Dopants that produce changes in conductivity may be classified as either electron donors or acceptors. A donor atom becomes incorporated in the crystal lattice of the semiconductor material and donates its weakly-bound valence electrons to the material, creating excess negative charge carriers. The weakly-bound electrons move about in the crystal lattice relatively freely and can facilitate conduction in the presence of an applied electric field. Conversely, an electron acceptor produces a "hole". Semiconductors doped with electron donors are termed N-type and semiconductors doped with electron acceptors are termed P-type. The N- and P-type designations indicate which charge carrier acts as the material's majority carrier.

For instance, pure semiconductor Si has four valence electrons. In Si, dopants may include those from International Union of Pure and Applied Chemistry (IUPAC) group 13 (also known as group III) and group 15 (also known as group V) elements. Group 15 elements (e.g., nitrogen, phosphorus, arsenic, and antimony) have five valence electrons that allow them to serve as donors when used to dope Si in order to become an N-type semiconductor. Conversely, group 13 elements (e.g., boron, aluminum, gallium, and indium) have three valence electrons that allow them to serve as acceptors when used to dope Si in order to become a P-type semiconductor.

Doped polysilicon conductivities may be greater than those of equally doped single-crystalline conductivities due to the dopant atoms being positioned at the grain boundaries. Doped polysilicon (e.g., formed from a $SiH_4$ precursor) is preferentially deposited in an amorphous configuration, as utilized in the present disclosure, and yields a smoother exposed surface, particularly when the deposition temperature in the reactor is 450° C. or less. However, as illustrated in table 100 of FIG. 1, there may be a long incubation period for nucleation of $SiH_4$ on a surface such as $SiO_2$. Such a long incubation period may indicate a high energy barrier for a vapor-to-solid phase change transition in such a situation.

As illustrated in FIG. 2, the semiconductor substrate 210 can, in various configurations, include a surface 230 upon which a number of semiconductor components 240 can be positioned. For instance, a layer of semiconductor material can be deposited upon the surface 230 of the semiconductor substrate 210 and a number of trenches 220 can be formed so as to convert the layer of deposited semiconductor material into the individual semiconductor components 240 (e.g., by way of example and not by way of limitation, floating gates in a NAND memory cell array, and the like) where the individual semiconductor components 240 can, in some embodiments, be isolated by the trenches 220 and a filler material (e.g., a dielectric such as $SiO_2$) deposited therein so as to partially fill the trenches 220.

In various configurations, an exposed surface 250 of the semiconductor components 240, the trenches 220, and/or the filler material in the trenches can have a layer (not shown) of silicon-containing material (e.g., $SiO_2$, and the like) deposited thereon. In some embodiments, the surface 230 on which the semiconductor components are positioned can also have a layer (not shown) of silicon-containing material (e.g., $SiO_2$, and the like) deposited thereon. The silicon-containing layer deposited on the exposed surface 250 can serve various functions and have appropriately varying thicknesses and, as such, is not explicitly shown in FIG. 2. A layer of doped semiconductor 260 can be deposited upon the silicon-containing layer deposited on the exposed surface 250. The layer of doped semiconductor material 260 can, in various configurations, have a number of thicknesses appropriate to the particular function being served and such thickness can determine a position of an outer surface 270 of the layer of doped semiconductor material 260.

Being deposited upon the silicon-containing layer (e.g., $SiO_2$) deposited on the exposed surface 250 of the semiconductor components 240, the trenches 220, and/or the filler material in the trenches can result in the layer of doped semiconductor material 260 at least partially filling the volume of the trenches 280 that remains exposed over the silicon-containing layer. For reasons presented herein (e.g., relating to long incubation periods for nucleation of the doped semiconductor material and/or uneven growth of a layer of the deposited doped semiconductor material), filling the volume of the trenches 280 with the doped semiconductor material 260 can leave voids 290 in the trenches. Such voids can become more likely when a doped semiconductor material precursor is being deposited upon a substrate having a different molecular configuration (e.g., a mixture of boron-containing gas with $SiH_4$ serving as a precursor for B-doped polysilicon being deposited on an amorphous and/or chemically different $SiO_2$ surface).

As will be appreciated by one of ordinary skill in the relevant art, a conformal precursor material tends, when deposited on a topography having varying heights, depths, peaks, valleys, etc., to form a deposited layer having a relatively uniform thickness in various locations. For example, tetraethyl orthosilicate (TEOS) can be deposited (e.g., by CVD) in a relatively uniform thickness in various locations and converted at elevated temperatures to an oxide material (e.g., as illustrated by a $SiO_2$ layer deposited at 250) also with a relatively uniform thickness in various locations to serve, for instance, as a dielectric material.

A non-conformal precursor material tends, when deposited on a topography having varying heights, depths, peaks, valleys, etc., to form a deposited layer having a relatively non-uniform thickness in various locations (e.g., varying in a thickness of deposition between an upper portion of a trench and a lower portion of the trench). For example, $SiH_4$ can be used to deposit polysilicon (e.g., by CVD) in such a manner as to form a relatively thicker layer at and/or around the top of elevated components adjacent the upper portion of a trench.

Further, non-conformal precursors such as $SiH_4$ and/or other silane-family compounds can continue to be deposited in a relatively thick layer in the upper portion of the trench but with the thickness decreasing as the depth of the trench lengthens, such that the amount of non-conformal precursor deposited in the lower portion of the trench can yield a thickness of a doped polysilicon layer, for example, that is notably less than the thickness at the upper portion of the trench. Such non-conformal deposition of the doped polysilicon layer can be exacerbated by the aforementioned long incubation periods for nucleation of the doped semiconductor and/or uneven growth of a layer of the deposited doped semiconductor when deposited upon a $SiO_2$ layer. For example, the outer surface 270 of the layer of doped semiconductor material 260 shown in the structure 200 illustrated in FIG. 2 has a markedly uneven topography.

Figure 3:
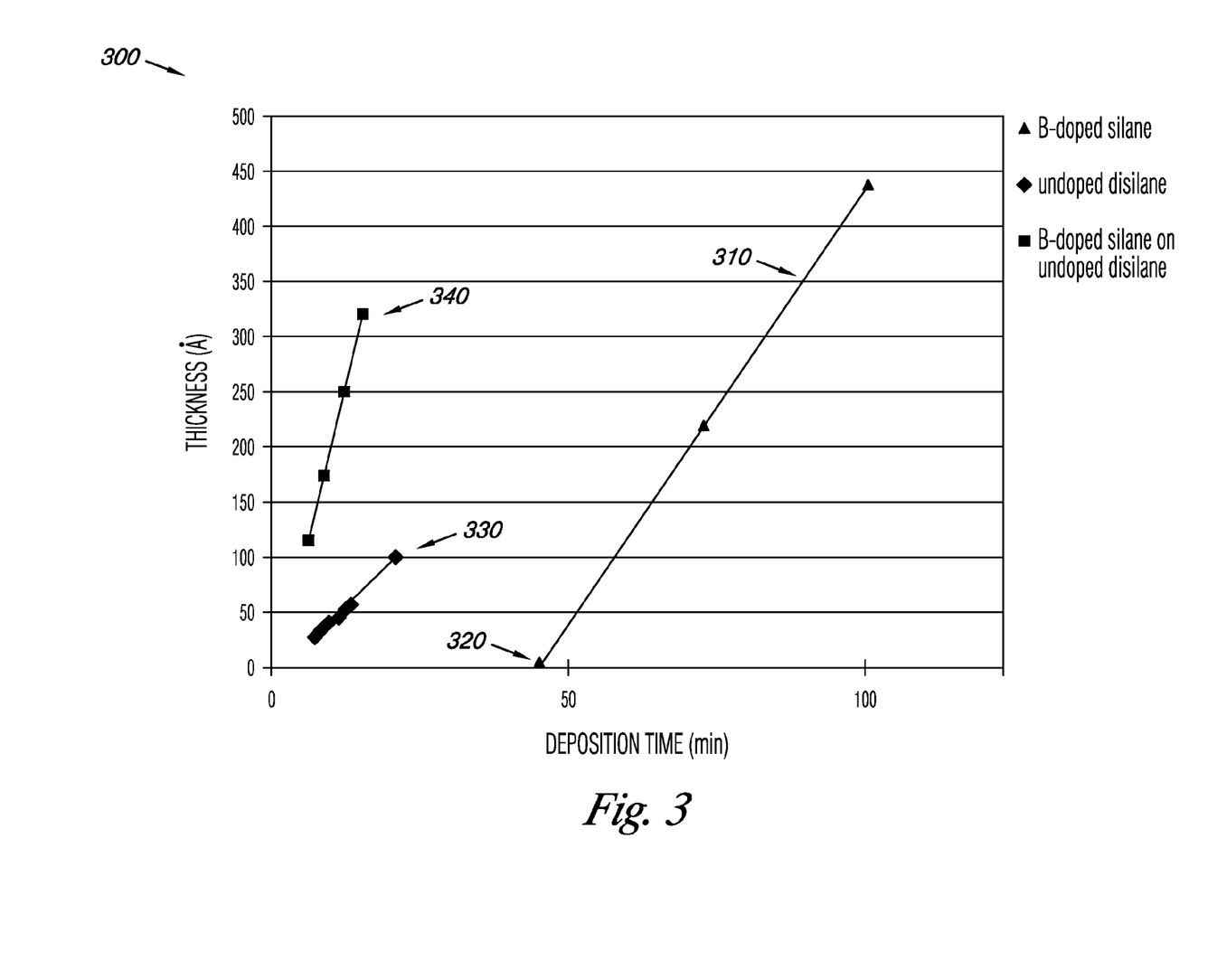
FIG. 3 is a graph illustrating deposition times for polysilicon using a boron-doped silane-deposited layer, an undoped disilane-deposited layer, and a boron-doped silane-deposited layer on an undoped disilane-deposited layer according to one or more embodiments of the present disclosure.

FIG. 3 is a graph illustrating deposition times for polysilicon using a boron-doped silane-deposited layer, an undoped disilane-deposited layer, and a boron-doped silane-deposited layer on an undoped disilane-deposited layer according to one or more embodiments of the present disclosure. The graph 300 illustrated in FIG. 3 shows a deposition time (min) on the horizontal axis, as used in a LPCVD reactor at around 420° C., versus a thickness (as measure in Å) of a layer deposited from a particular precursor material on the vertical axis.

In graph 300, a thickness of a layer of B-doped polysilicon (e.g., at 8.00 E+20 molecules of $B/cm^3$) deposited by a B-containing gas ($BCl_3$) in a $SiH_4$ precursor gas 310 (i.e., a B-doped $SiH_4$ precursor) on a layer of $SiO_2$ is compared to a thickness of a polysilicon deposited by an undoped disilane ($Si_2H_6$) precursor gas 330 on the layer of $SiO_2$ after thermal decomposition at particular deposition times. Consistent with the results shown in Table 100 of FIG. 1, formation of a B-doped polysilicon from a B-doped $SiH_4$ precursor 310 on a layer of $SiO_2$ demonstrates a relatively long incubation period before growth of a film is evidenced. In this instance, the B-doped polysilicon layer was less than 450 Å at 100 min deposition time. Linear regression analysis of data points on graph 300 to an intersection with the horizontal axis (e.g., a hypothetical thickness of 0.0 Å) allows an incubation time for nucleation (e.g., nucleation time) to be derived. The nucleation time 320 for the B-doped $SiH_4$ precursor 310 is shown to be around 45 min in graph 300.

By comparison, a thickness of a layer of undoped polysilicon deposited by the undoped $Si_2H_6$ precursor 330 on a layer of $SiO_2$ was measured after thermal decomposition at particular deposition times. As shown in graph 300, there is a measured thickness of 100 Å utilizing the undoped $Si_2H_6$ precursor in a notably shorter deposition time than achieved with the B-doped $SiH_4$ precursor (e.g., around 20 min versus 60 min).

As such, there appears to be a higher energy barrier for a vapor-to-solid phase change transition when forming a B-doped polysilicon layer from a B-doped $SiH_4$ precursor on a layer of $SiO_2$ than when forming an undoped polysilicon layer deposited by the undoped $Si_2H_6$ precursor on the layer of $SiO_2$. The lower energy barrier appears to enable a shorter nucleation time for the undoped $Si_2H_6$ precursor. Hence, it was of particular interest to determine whether a shorter nucleation time exists for a B-doped $SiH_4$ precursor on a layer of undoped polysilicon formed from the $Si_2H_6$ precursor than when forming the B-doped polysilicon layer on the layer of $SiO_2$.

Of particular note, the graph 300 illustrated in FIG. 3 shows evidence for a shorter nucleation time for the B-doped $SiH_4$ precursor on an undoped polysilicon 340 formed by deposition of the undoped $Si_2H_6$ precursor. In the example illustrated in FIG. 3, the B-doped $SiH_4$ precursor was deposited on a 50 Å thick layer on the undoped polysilicon formed by deposition of the undoped $Si_2H_6$ precursor. The thickness of the deposited B-doped polysilicon layer 340 excludes the thickness of the underlying undoped polysilicon formed by deposition of the undoped $Si_2H_6$ precursor. Graph 300 shows that the thickness of the deposited B-doped polysilicon layer 340 exceeds 100 Å by approximately 6 min deposition time on the undoped polysilicon formed by deposition of the undoped $Si_2H_6$ precursor, whereas the nucleation time 320 of the B-doped $SiH_4$ precursor on the $SiO_2$ has not yet been reached.

Figure 4:
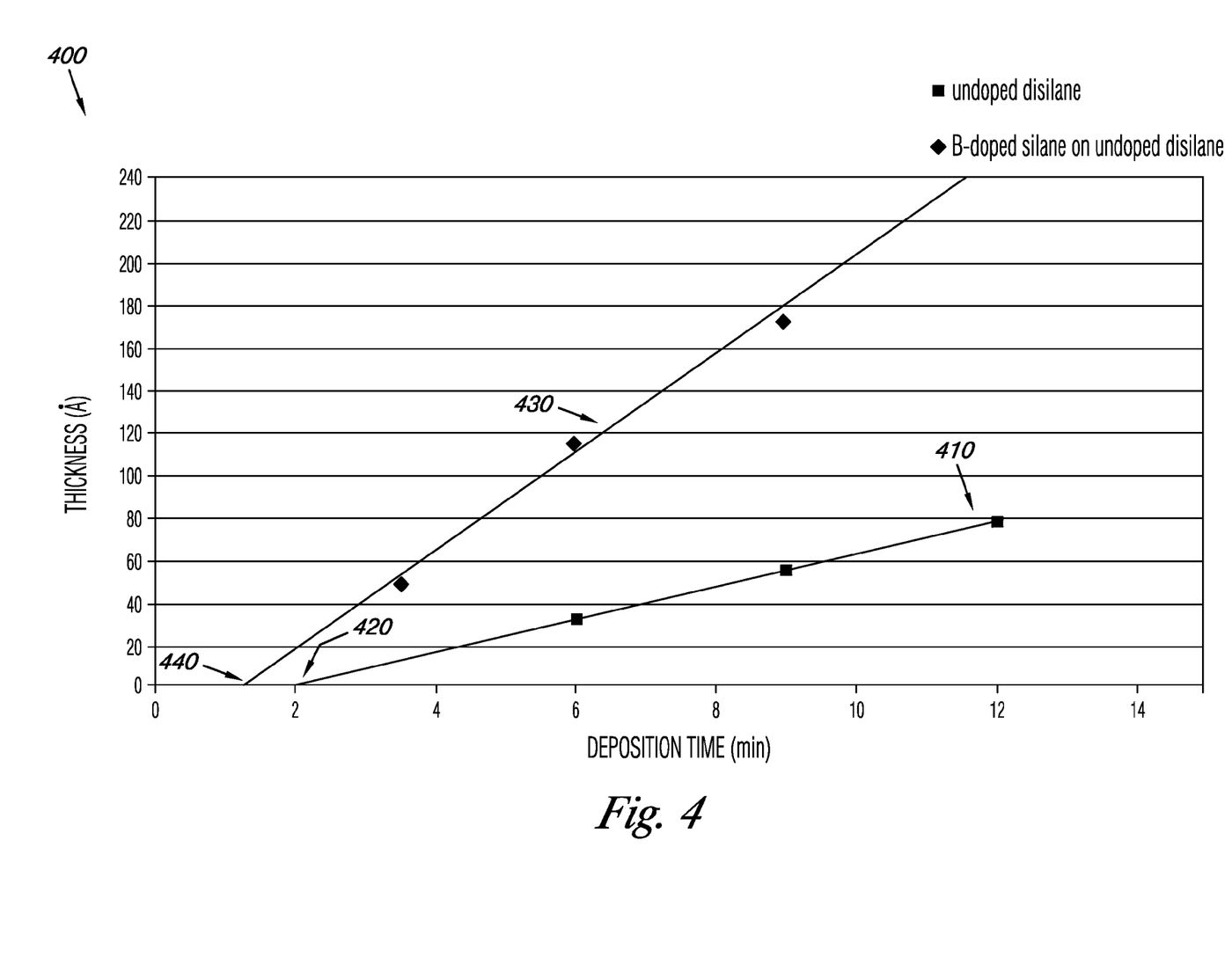
FIG. 4 is a graph illustrating deposition times for polysilicon using an undoped disilane-deposited layer and a boron-doped silane-deposited layer on an undoped disilane-deposited layer according to one or more embodiments of the present disclosure.

FIG. 4 is a graph illustrating deposition times for polysilicon using an undoped disilane-deposited layer and a boron-doped silane-deposited layer on an undoped disilane-deposited layer according to one or more embodiments of the present disclosure. The graph 400 illustrated in FIG. 4 is similar to graph 300 shown in FIG. 3, although graph 400 is localized toward the intersection of the horizontal and vertical axes to allow nucleation times to be determined. As such, graph 400 shows a deposition time (min) on the horizontal axis, as used in a LPCVD reactor at around 420° C., versus a thickness (as measure in Å) of a layer deposited from a particular precursor material on the vertical axis.

In graph 400, a thickness of a layer of undoped polysilicon deposited by the undoped $Si_2H_6$ precursor 410 on a layer of $SiO_2$ was measured on the layer of $SiO_2$ after thermal decomposition at particular deposition times. Consistent with the results shown in Table 300 of FIG. 3, formation of an undoped polysilicon layer from the undoped $Si_2H_6$ precursor 410 on a layer of $SiO_2$ demonstrates a relatively short incubation period compared to the B-doped $SiH_4$ precursor shown in FIG. 3. In this instance, the B-doped polysilicon layer formed from the undoped $Si_2H_6$ precursor 410 was around 35 Å thick at 6 min deposition time and 80 Å thick at 12 min deposition time. Linear regression analysis of the data points shown on graph 400 enables derivation of a nucleation time 420 for the undoped $Si_2H_6$ precursor 410 of around 2 min. Further trials showed that nucleation times of around 2 min for the undoped $Si_2H_6$ precursor can reproducibly be achieved at reactor temperatures of 400° C. or lower, which may contribute to desired characteristics in filling of trenches by preferentially allowing conformal deposition of the undoped polysilicon, with reduced void formation, as a result of rapid nucleation.

Of particular note, the graph 400 illustrated in FIG. 4 shows a B-doped $SiH_4$ precursor deposited at 420° C. on an undoped polysilicon 430 formed by deposition of the undoped $Si_2H_6$ precursor. Formation of a B-doped polysilicon layer on an undoped polysilicon layer formed from an undoped $Si_2H_6$ precursor on a layer of $SiO_2$ demonstrates a relatively short incubation period compared to the B-doped $SiH_4$ precursor on the $SiO_2$ layer, as shown in FIG. 3. In this instance, the B-doped polysilicon formed on the undoped polysilicon formed from the $Si_2H_6$ precursor 430 was around 115 Å thick at 6 min deposition time and 175 Å thick at 9 min deposition time. Linear regression analysis of the data points shown on graph 400 enables derivation of a nucleation time 440 for the B-doped $SiH_4$ precursor 430 of around 1.0-1.5 min when deposited on the undoped polysilicon 430.

Hence, the nucleation time of the B-doped $SiH_4$ precursor can be reduced, relative to the nucleation time achieved on a $SiO_2$ layer, when an undoped polysilicon has been previously deposited upon the $SiO_2$ layer. Moreover, the nucleation time of the B-doped $SiH_4$ precursor even can be reduced relative to the nucleation time achieved by an undoped polysilicon being deposited on a SiO$_2$ layer utilizing the undoped Si$_2$H$_6$ precursor. Further trials showed that a nucleation time of around 1.0-1.5 min for the B-doped SiH$_4$ precursor can reproducibly be achieved at reactor temperatures of 400-420° C. on the undoped polysilicon deposited on the SiO$_2$ layer utilizing an undoped Si$_2$H$_6$ precursor. Such short nucleation times are not witnessed when using an undoped SiH$_4$ precursor in the 400-420° C. temperature range, apparently due to the relatively higher decomposition energy of SiH$_4$. Use of an undoped Si$_2$H$_6$-deposited polysilicon appears to overcome the high decomposition energy of SiH$_4$ and allow nucleation at the lower temperature range. Additionally, such a nucleation time is notably shorter than nucleation times measured for B-doped SiH$_4$ precursors being deposited on SiO$_2$ layers at temperatures in the range of 520-600° C.

Such short nucleation times for the undoped Si$_2$H$_6$ precursor and the B-doped SiH$_4$ precursor appear to accelerate growth of their respective polysilicon layers, which may contribute to desired characteristics in filling of trenches by preferentially allowing conformal deposition of the two silicon layers with reduced void formation. Reduction in void formation may at least partially result from a more uniform creation and disposition of nucleation sites contributing to a smoother surface of the growing polysilicon layers. Further, evidence that a growth rate of a B-doped polysilicon layer can be enhanced by deposition upon an undoped polysilicon layer is provided by comparing the slope of line 340 in FIG. 3 with the slope of line 310 after the incubation period has elapsed, which may further contribute to a reduced incidence of void formation.

Repeated trials have shown that to obtain a continuous, uninterrupted deposition layer of B-doped polysilicon on a SiO$_2$ surface at around a temperature of 420° C., a thickness of around 120 Å should exist at some locations in order to compensate for the uneven distribution of nucleation sites and/or the broad distribution of nucleation times contributing to uneven thermal decomposition of the B-doped SiH$_4$. In contrast, a continuous, uninterrupted layer of undoped polysilicon on a SiO$_2$ surface at around a temperature of 420° C. has repeatedly been observed to occur when a thickness of around 40 Å exists at some locations, which reflects the more conformal nature of undoped Si$_2$H$_6$ deposition relative to B-doped SiH$_4$ deposition at relatively low temperatures.

The more conformal nature may possibly be attributable to a lesser energy barrier for nucleation of undoped Si$_2$H$_6$ on a SiO$_2$ surface at around a temperature of 420° C. However, as illustrated in graph 400 and described in the present disclosure, depositing the B-doped SiH$_4$ on a layer (e.g., with a 50 Å thickness) of undoped polysilicon can overcome the disparity in nucleation times between B-doped SiH$_4$ and undoped Si$_2$H$_6$, which may reflect equalization in the energy barriers for such deposition. Moreover, the exposed surface of B-doped polysilicon deposited on an undoped polysilicon is observed to be more conformal (e.g., smoother) than an exposed surface of B-doped polysilicon deposited directly on a SiO$_2$ surface at around a temperature of 420° C.

Accordingly, an undoped polysilicon formed from, for example, an undoped Si$_2$H$_6$ precursor can serve as a "seed" to accelerate growth and formation of a doped polysilicon thereon. In various embodiments, a seed first layer can serve to accelerate growth and formation of N-type semiconductor layers with group V elements (e.g., nitrogen, phosphorus, arsenic, and/or antimony) selected as dopants or P-type semiconductor layers with group III elements (e.g., boron, aluminum, gallium, and/or indium) selected as dopants.

FIG. 5 illustrates a representative cross-sectional view of reduction of void formation in trenches resulting from deposition of polysilicon using a boron-doped silane-deposited layer on an undoped disilane-deposited layer according to one or more embodiments of the present disclosure. Similar to that illustrated in FIG. 2, a structure 500 as illustrated in FIG. 5 can, in some embodiments of the present disclosure, represent a semiconductor structure 500 positioned on a semiconductor substrate 510, which can have a number of materials (e.g., various conductors, semiconductors, dielectrics, among other materials) positioned thereon to form a number of components (e.g., gates, and the like). Such a structure 500 can, for example, include a number of trenches (e.g., at 520) that separate portions of the semiconductor substrate 510 and the components positioned thereon, which can control electrical interaction between the various components associated with the structure 500.

As illustrated in FIG. 5, the semiconductor substrate 510 can, in various embodiments, include a surface 530 upon which a number of components 540 can be positioned. For example, in various embodiments, a layer of semiconductor material can be deposited upon the surface 530 of the semiconductor substrate 510 and a number of trenches 520 can be formed so as to convert the layer of deposited semiconductor material into the individual semiconductor components 540 (e.g., by way of example and not by way of limitation, floating gates in a NAND memory cell array, and the like) where the individual semiconductor components 540 can, in some embodiments, be isolated by the trenches 520 and a filler material (e.g., a dielectric such as SiO$_2$) deposited therein so as to partially fill the trenches 520. In some embodiments, in particular where the electronic components are 100 nm or less apart, an effective intervening trench can have a width in the range of 20-30 nm.

In various embodiments, an exposed surface of the semiconductor components 540, the trenches 520, and/or the filler material in the trenches can have a layer (not shown) of silicon-containing material (e.g., SiO$_2$, and the like) deposited thereon (e.g., as a dielectric). In some embodiments, the surface 530 on which the semiconductor components are positioned can also have a layer (not shown) of silicon-containing material (e.g., SiO$_2$, and the like) deposited thereon. The silicon-containing material layer deposited on the exposed surface can serve various functions and have appropriately varying thicknesses and, as such, is not explicitly shown in FIG. 5.

A layer of undoped polysilicon 550 can, in various embodiments, be deposited upon an exposed surface of the, for example, SiO$_2$ layer. The layer of undoped polysilicon 550 can result from depositing a first precursor material, which can, in some embodiments, be a gaseous undoped Si$_2$H$_6$ precursor utilized in a LPCVD reactor. As such, embodiments of the present disclosure can include depositing a first precursor material on a surface of an unfilled portion of a trench at a particular temperature to form an undoped polysilicon for covering walls and a bottom of the unfilled portion of the trench, as shown at 550 in FIG. 5. In various embodiments, the undoped polysilicon can be formed on the walls and the bottom of a solid SiO$_2$ surface of the trench to a substantially uniform thickness in a range of 1-7 nanometers.

A layer of doped polysilicon 560 can, in various embodiments, be deposited upon the undoped polysilicon first layer 550. The layer of doped polysilicon 560 can result from depositing a second precursor material, which can, in some embodiments, be a gaseous B-doped SiH$_4$ precursor utilized in a LPCVD reactor. As such, embodiments of the present disclosure can include depositing a second precursor material on a surface of the undoped polysilicon at substantially the same temperature to form a doped polysilicon. The undoped polysilicon can, for example, serve as a seed to contribute to and/or accelerate forming a doped polysilicon. Forming the doped polysilicon can be contributed to and/or accelerated, for example, by improving uniformity of and/or decreasing an incubation time for doped polysilicon nucleation at the particular temperature.

The doped polysilicon second layer 560 can, in various embodiments, have a number of thicknesses appropriate to the particular function being served and such thickness can determine a position of an outer surface 570 of the doped polysilicon second layer 560. The dopant in the doped polysilicon second layer 560 can, in various embodiments, include atoms selected from group V elements (e.g., nitrogen, phosphorus, arsenic, and/or antimony) in order to become an N-type semiconductor or from group III elements (e.g., boron, aluminum, gallium, and/or indium) in order to become a P-type semiconductor. Depending on the particular embodiment, the N-type and P-type semiconductors may be considered as being formed from the combination of a doped polysilicon and an undoped polysilicon or from the doped polysilicon by itself.

Being deposited upon the silicon-containing layer (e.g., SiO2) deposited on the exposed surface of the semiconductor components 540, the trenches 520, and/or the filler material in the trenches can result in the undoped polysilicon 560 at least partially filling the volume of the trenches 580 that remains exposed over the silicon-containing layer (not shown). In various embodiments, a CVD (e.g., LPCVD) reactor can be utilized to partially fill a trench 580 on the surface of the semiconductor structure 500 with the undoped polysilicon 550 to a substantially uniform thickness on walls and a bottom of the trench 580 and to fill a remainder of the trench 580 with the doped polysilicon 560. Depositing the first precursor material on the surface of the unfilled portion of the trench can include depositing the first precursor material on the surface of the unfilled portion of a trench having a width in a range of 20-30 nanometers and a depth of at least 50 nanometers.

As shown at 410 in graph 400, the undoped polysilicon can be formed by chemical vapor deposition at the particular temperature and a particular pressure that induces nucleation at around 2 minutes. As shown at 440 in graph 400, the doped polysilicon can be formed by chemical vapor deposition over the formed undoped polysilicon at the particular temperature and the particular pressure by inducing nucleation of the doped polysilicon at around 1 minute. In accordance with the teachings of the present disclosure, the doped and undoped polysilicon can be formed with the particular temperature and the particular pressure at levels selected to induce conformal deposition in a substantially amorphous configuration in order to reduce a likelihood of void formation in the trench.

Reduction of nucleation times to 1-2 min for the first and second precursor materials at substantially the same temperature and/or relatively smooth, conformal growth of the undoped polysilicon layer 550 and/or the doped polysilicon layer 560 may contribute to filling the volume of the trenches 580 with a significantly reduced number of voids left in the trenches. For instance, when using direct deposition of a doped polysilicon layer into trenches, as described with regard to structure 200 in FIG. 2, an occurrence of 25-30 voids per 100 trenches has been found. In contrast, when depositing a doped polysilicon layer onto an undoped polysilicon layer, as described with regard to FIGS. 3-5, the occurrence of voids in the trenches is seen to be notably reduced, and in some trials such voids are absent.

The reduction in void formation may possibly result from an increased number of nucleation sites on the undoped polysilicon layer and/or a more uniform distribution of such nucleation sites for formation of the doped polysilicon layer, which also may serve as seeds for accelerating growth of the doped polysilicon layer. A combination of such factors appears to contribute to a more conformal deposition pattern for the doped polysilicon layer (e.g., from a B-doped $SiH_4$ precursor). Accordingly, an exposed surface 570 of the doped polysilicon layer 560 shown in the structure 500 illustrated in FIG. 5 has a notably smoother topography compared to the exposed surface 270 shown in FIG. 2. For instance, studies of the surface topography (e.g., varying heights, depths, peaks, valleys, etc.) of deposited doped polysilicon layers formed from a B-doped $SiH_4$ precursor have demonstrated a root mean square (RMS) variability in height of less than 1 nm.

In some embodiments of the present disclosure, filling the unfilled portion of the trench with the undoped polysilicon and the doped polysilicon can serve as a control gate in a non-volatile memory cell. For example, by way of example and not by way of limitation, the individual semiconductor components 540 shown in FIG. 5 can represent floating gates in a non-volatile memory cell array where the floating gates are isolated by the lower portion of the trenches being partially filled with a dielectric such as $SiO_2$. Covering the floating gates and filling the remaining portion of the trenches with the undoped and the doped polysilicon formed upon an intermediary dielectric layer (e.g., formed from $SiO_2$) can provide a control gate that may, for instance, have a "finger" extending into the trenches. As such, a control gate can be formed around a floating gate, as illustrated in FIG. 5.

An electrical advantage is achieved for control gates when utilizing a P-type semiconductor doped with dopant atoms selected from group III elements (e.g., boron, aluminum, gallium, and/or indium) compared to when utilizing an N-type semiconductor with dopant atoms selected from group V elements (e.g., nitrogen, phosphorus, arsenic, and/or antimony). For instance, there may be charge depletion in a narrow N-type control gate (e.g., when utilized between floating gates) due to electron migration. Such charge depletion may be countered by utilizing a P-type control gate in which charges remain accumulated in holes. As such, utilizing P-type doping may provide a better gate coupling ratio during programming of non-volatile memory cells and/or a better cell-to-cell shielding during a read operation of the non-volatile memory cells.

Further advantages of utilizing P-type doping in a control gate can include suppression of direct tunneling current between the control gate and an active region, for instance, during an erase operation, which contributes to a mechanism for degradation reliability. Utilizing P-type doping in the control gate can suppress tunneling of electrons from the control gate to the floating gate, which contributes to a more negative erase saturation threshold voltage (Vt). Additionally, utilizing P-type doping can enable the control gate to have a higher work function voltage (e.g., by 1 Volt), which also can contribute to a correspondingly higher cell Vt and cell program saturation Vt.

According to embodiments of the present disclosure, tools including apparatuses and devices can be used for chemical vapor deposition (CVD) and/or exposure to an environs with elevated temperature. Such apparatuses and devices can be used to perform various techniques that include low pressure chemical vapor deposition (LPCVD), high-density plasma chemical vapor deposition (HDP-CVD), plasma-enhanced chemical vapor deposition (PECVD), high pressure liquid injection metalorganic chemical vapor deposition (HP-MOCVD), hot-wall reduced pressure liquid-injection atomic layer deposition (ALD), ultra-high-vacuum molecular-beam epitaxy (MBE) using e-beam evaporation, high vacuum sputtering, in situ steam generation (ISSG), furnace annealing, and furnace oxide deposition, among others. Some of these apparatuses, devices, and techniques are described below in connection with FIG. 6 by way of example and not by way of limitation.

Figure 6:
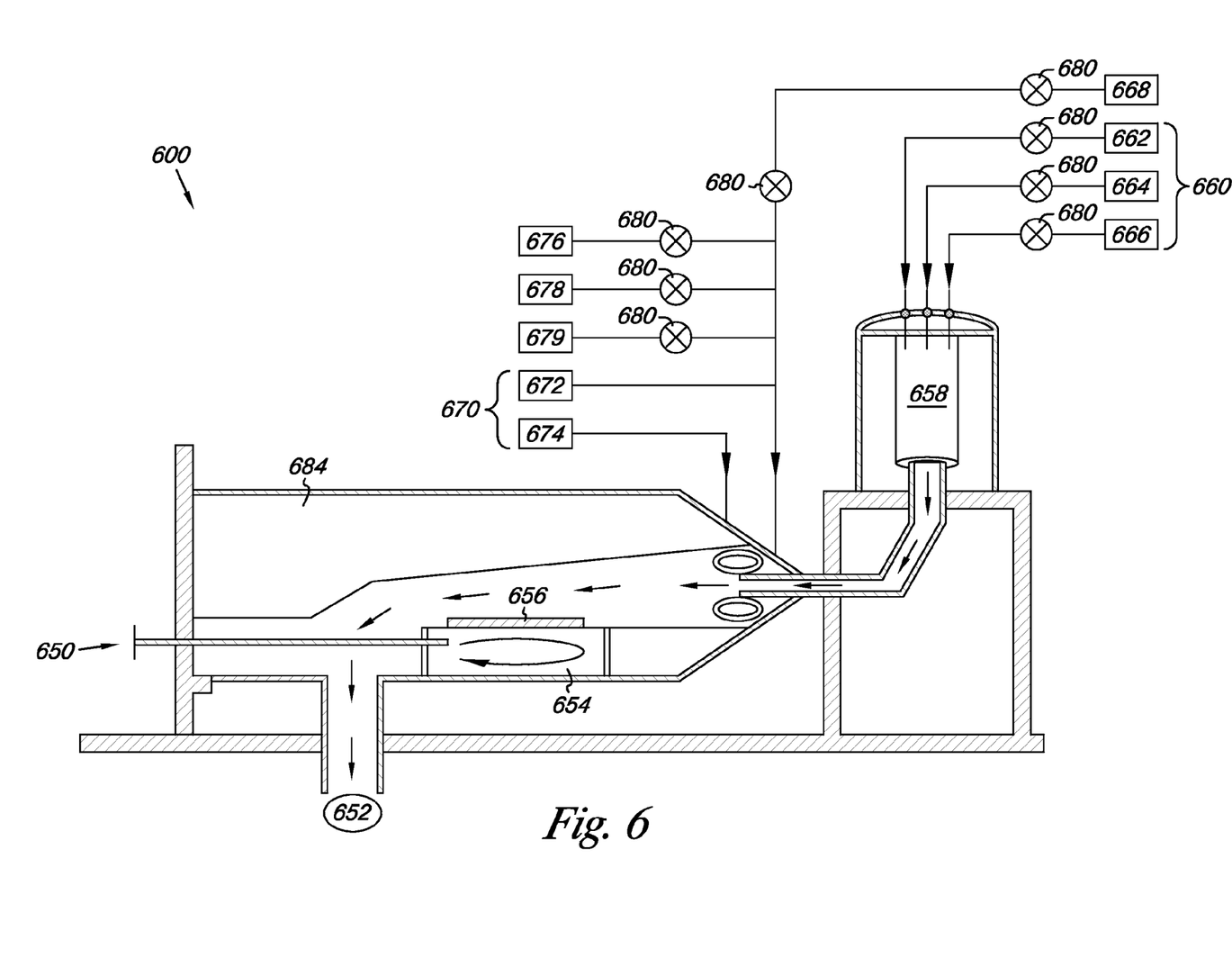
FIG. 6 illustrates a representative chemical vapor deposition reactor that can be used in accordance with one or more embodiments of the present disclosure.

FIG. 6 illustrates a representative chemical vapor deposition reactor that can be used in accordance with one or more embodiments of the present disclosure. The elements depicted permit discussion of the present disclosure such that those skilled in the art may practice the present disclosure without undue experimentation. In FIG. 6, a target 656 (e.g., a structure having a number of trenches and/or other topographical irregularities) can be located inside a reaction chamber 684 of a CVD) reactor 600. Also located within the reaction chamber 684 can be a heated rotary stage 654, which can be thermally coupled to target 656 to control the target temperature. A vaporizer 658 (e.g., a heated gas generator) can introduce precursor gases (e.g., $SiO_2$, $Si_2H_6$, $SiH_4$, and dopant gases as described herein, among others) to the target 656. Each precursor can originate from sources 660, including sources 662, 664, 666, and also 668, whose flow can be controlled by mass-flow controllers 680. In some embodiments, sources 660 can provide precursor gases by providing a liquid material to form the selected precursor gas in vaporizer 658.

Also included in the CVD reactor 600 can be purging gas sources 670 including 672 and 674. Furthermore, additional purging gas sources can be constructed in CVD reactor 600, one purging gas source for each precursor gas, for example. For a process that uses the same purging gas for multiple precursor gases, less purging gas sources are required for the CVD reactor system 600. The CVD reactor 600 also can include gas sources 676, 678, and 679 for introduction to reaction chamber 684 without needing to be vaporized at 658. Reaction chamber 684 also can be coupled to vacuum pump, or exhaust pump, 652, after thermocouple 650, to remove excess precursor gases, purging gases, and by-product gases at the end of a purging sequence from the reaction chamber 684.

For convenience, control displays, mounting apparatus, temperature sensing devices, substrate maneuvering apparatus, and necessary electrical connections, as appreciated by those skilled in the art, are not shown in FIG. 6. Although a CVD reactor as illustrated in FIG. 6 is suitable for practicing the present disclosure, other CVD reactor configurations can be utilized.

The use, construction and fundamental operation of CVD reaction chambers for deposition of layers are understood by those of ordinary skill in the art of semiconductor processing. The present disclosure may be practiced on a variety of such reaction chambers without undue experimentation. Furthermore, one of ordinary skill in the art will comprehend the necessary detection, measurement, and control techniques in the art of semiconductor processing upon reading the present disclosure.

The elements of a CVD reactor 600 as illustrated in FIG. 6 can be controlled by a medium having instructions stored thereon for executing performance of processes performed by the CVD reactor. For example, such instructions can, in various embodiments, be stored in hardware (e.g., an application-specific integrated circuit), firmware, and/or software memory and, in some embodiments, be executed by a processor (e.g., of a computer). A computer readable medium can include instructions stored thereon that are executable by a processor to direct a CVD reactor to perform activities that enable processing of a structure according to embodiments of the present disclosure. To focus on the use of CVD reactor 600 in the various embodiments of the present disclosure, such apparatuses for storing and/or executing instructions are not shown. Those skilled in the art can appreciate that the individual elements such as pressure control, temperature control, and gas flow within CVD system 600 can be under control of such apparatuses.

Among other layers of a semiconductor structure, the CVD reactor 600 can be used to form an undoped polysilicon from a first precursor material (e.g., at 550 as described above in connection with FIG. 5). In some embodiments, formation of the undoped polysilicon can be performed after some preliminary steps. For example, appropriate temperature degassing of the reaction chamber 684 can be performed (e.g., pre-baking at 450° C. in an ultra-pure nitrogen environment to help provide complete desorption of hydrogen, oxygen, and moisture for a relatively contamination-free surface of a number of exposed surfaces of a semiconductor structure prior to deposition of the first precursor material. Furthermore, pre-cleaning of a target 656, interface oxidation, and/or in-situ vapor-phase removal of native oxide from the surface of the target 656 can be performed prior to deposition of the first precursor material.

In various embodiments, the reaction chamber 684 of the CVD reactor 600 can be equipped for application of an elevated temperature that can be used in accordance with embodiments of the present disclosure. The temperature of the target 656 and the reaction chamber 684 environs can be controlled by a heater assembly (not shown) that can, in some embodiments, include an instrument such as an optional reflector and/or a thermocouple in close proximity to the target 656. According to embodiments of the present disclosure, a substantially constant temperature in a range of 380-450° C. can be maintained in the reaction chamber 684 in order to allow one-step deposition of the first precursor material and the second precursor material by thermal decomposition on the exposed surface of the semiconductor structure (e.g., in the trenches thereon). A distribution ring (not shown) can be located below a shutter. The distribution ring can be a manifold that distributes precursor- and/or dopant-containing gases around exposed surfaces of the target 656, at a range of pressures appropriate for the purpose to be accomplished.

The reaction chamber 684 can be configured with a vacuum pump, which can be the same or different from the vacuum pump 652, for evacuating the chamber to a pressure in a range of 0.2-0.5 Torr. According to embodiments of the present disclosure, the relatively low pressure in the range of 0.2-0.5 Torr can, among other reasons, be utilized to preferentially promote an amorphous configuration of the undoped polysilicon and/or the doped polysilicon.

Optional detectors and/or monitors may be included on the interior and/or exterior of the CVD system 600, such as an interiorly situated detector (not shown) for detecting a thickness of a number of deposited layers and an exteriorly situated monitor (not shown) for displaying a thickness of a layer and/or a lead connected to a memory apparatus for executing control over performance of semiconductor processing (not shown). Various types of layers can be formed to a range of suitable thicknesses (e.g., from approximately 5 Å to about 2000 Å) by controlling duration of vapor deposition.

In accordance with one or more embodiments of the present disclosure, a CVD reactor, in various embodiments, can be operated by depositing a gaseous $Si_2H_6$ in a trench on a solid $SiO_2$ surface of the trench at a temperature that induces thermal decomposition of disilane into an undoped polysilicon to cover walls and a bottom of the solid $SiO_2$ surface of the trench. The CVD reactor can be operated by depositing a gaseous $SiH_4$ and a gaseous boron-containing dopant on a surface of the undoped polysilicon at substantially the same temperature, Accordingly, the CVD reactor can operate by inducing nucleation of the gaseous $SiH_4$ and the gaseous boron-containing dopant and accelerating conformal forming of a boron-doped polysilicon by the undoped polysilicon serving as a seed in order to reduce a likelihood of void formation in the trench.

Forming the undoped polysilicon layer on the walls and the bottom of the trench can, in various embodiments, include forming the undoped polysilicon first layer to a substantially uniform thickness in a range of 1-7 nanometers. The substantial uniformity in thickness can be a result of the conformal nature of deposition of the $Si_2H_6$ precursor material, in particular when deposited upon a conformal solid $SiO_2$ layer.

Depositing the $SiH_4$ and the B-containing dopant can, in various embodiments, include inducing thermal decomposition thereof to form the B-doped polysilicon in a temperature range of 380-450° C. Whatever particular temperature is selected in the temperature range of 380-450° C. is substantially the same temperature utilized to induce thermal decomposition of $Si_2H_6$ into an undoped polysilicon first layer to cover walls and a bottom of a trench.

In accordance with the teachings of the present disclosure, chemical vapor deposition with a substantially stable temperature in the range of 380-450° C. and with a substantially stable pressure in a range of 0.2-0.5 Torr can be utilized to induce a substantially amorphous configuration of the B-doped polysilicon. Moreover, the substantially stable temperature in the range of 380-450° C. and with the substantially stable pressure in a range of 0.2-0.5 Torr can be utilized to induce a substantially amorphous configuration of the undoped polysilicon.

The CVD reactor can, in various embodiments, be operated to result in a dopant atom concentration of 1% or less in the doped polysilicon. Such a dopant can be selected from group V elements (e.g., nitrogen, phosphorus, arsenic, and/or antimony) in order to become an N-type semiconductor or from group III elements (e.g., boron, aluminum, gallium, and/or indium) in order to become a P-type semiconductor. For example, the CVD reactor can be operated by adjusting flow rates of the gaseous $SiH_4$ and the gaseous B-containing dopant (e.g., $BCl_3$, $B_2H_6$, and the like) during chemical vapor deposition such that the boron atom density in the B-doped polysilicon is in a range of 0.1-1.0% per cubic centimeter of the B-doped polysilicon. For instance, polysilicon has on the order of $10^{23}$ silicon atoms/cm³ and a concentration of boron atoms therein in a range of $1-8\times10^{20}$, as described in the present disclosure, would constitute a concentration of less than 1% of boron atoms.

Figure 7:
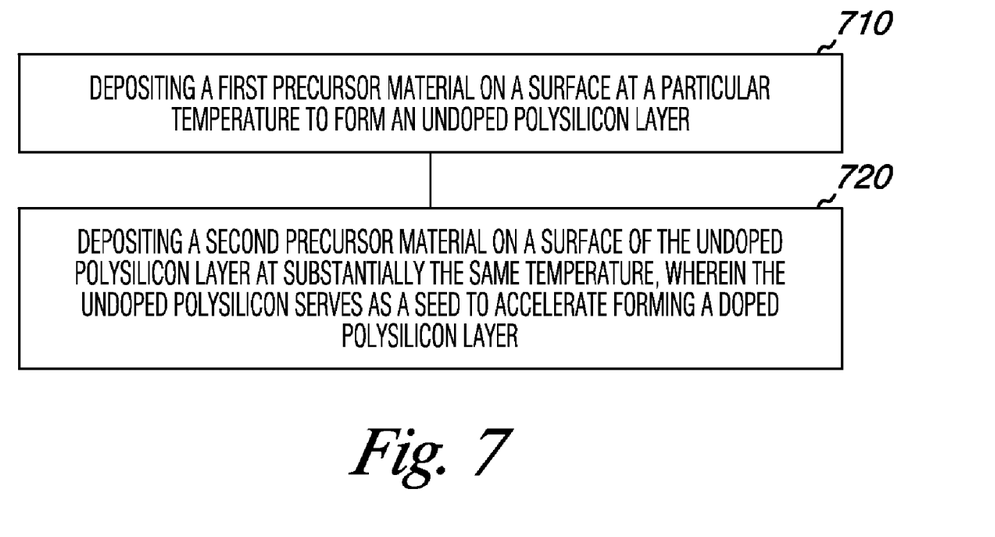
FIG. 7 is a block diagram that illustrates processing a semiconductor structure according to one or more method embodiments of the present disclosure.

FIG. 7 is a block diagram that illustrates processing a semiconductor structure according to one or more method embodiments of the present disclosure. Unless explicitly stated, the method embodiments described herein are not constrained to a particular order or sequence. Additionally, some of the described method embodiments, or elements thereof, can occur or be performed at the same, or at least substantially the same, point in time.

The embodiment illustrated in FIG. 7 includes depositing a first precursor material on a surface (e.g., of a semiconductor structure) at a particular temperature to form an undoped polysilicon, as shown at block 710. In some embodiments, depositing the first precursor material can include depositing $Si_2H_6$ that undergoes thermal decomposition to the undoped polysilicon in a temperature range of 380-450° C.

As shown in block 720, depositing a second precursor material can be deposited on a surface of the undoped polysilicon at substantially the same temperature, where the undoped polysilicon can serve as a seed to accelerate forming a doped polysilicon. In some embodiments, depositing the second precursor material can include depositing $SiH_4$ and a boron-containing dopant that undergo thermal decomposition to the doped polysilicon in a temperature range of 380-450° C. In such embodiments, forming the doped polysilicon can include forming a P-type semiconductor structure in combination with the undoped polysilicon.

In some embodiments, depositing the second precursor material can include depositing $SiH_4$ and a phosphorus-containing dopant that undergo thermal decomposition to the doped polysilicon in a temperature range of 380-450° C. In such embodiments, forming the doped polysilicon can include forming an N-type semiconductor structure in combination with the undoped polysilicon.

In accordance with the teachings of the present disclosure, semiconductor processing can include reducing a nucleation time of the second precursor material at multiple sites on the undoped polysilicon. Further, reducing the nucleation time can include reducing a length of time for formation of a doped polysilicon as compared to formation of the doped polysilicon in the absence of the undoped polysilicon.

Moreover, semiconductor processing can include utilizing chemical vapor deposition to partially fill an unfilled portion of a trench on the surface (e.g., of a semiconductor structure) with the undoped polysilicon to a substantially uniform thickness on walls and a bottom of the unfilled portion of the trench and to fill a remainder of the trench with the doped polysilicon. Possibly as a consequence of the preceding, filling of trenches on the surface with doped polysilicon can be performed with a reduced occurrence of void formation compared to deposition in the absence of an intermediary undoped polysilicon between an underlying layer of, for example, $SiO_2$ and the doped polysilicon.

Although specific embodiments have been illustrated and described herein, those of ordinary skill in the relevant art will appreciate that an arrangement calculated to achieve the same results can be substituted for the specific embodiments shown. This disclosure is intended to cover all adaptations or variations of various embodiments of the present disclosure.

Reference is made to various specific embodiments in which the disclosure may be practiced herein. These embodiments are described with sufficient detail to enable those skilled in the art to practice the disclosure. It is to be understood, however, that changes may be implemented to structural, logical, and electrical components to achieve the same results and still remain within the teachings of the present disclosure.

It is to be further understood that the above description has been made in an illustrative fashion, and not a restrictive one. Combination of the above embodiments, and other embodiments not specifically described herein, will be apparent to those of ordinary skill in the relevant art upon reviewing the above description.

The applicability of the various embodiments of the present disclosure includes other applications in which the above structures, apparatuses, devices, and methods are used, for example, in implementations other than CVD reactors associated with computer systems. Therefore, the applicability of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure need to use more features than are expressly recited in each claim.

Rather, as the following claims reflect, inventive subject matter lies in less than all features of a single disclosed embodiment. Thus, the following claims are hereby incorporated into the Detailed Description, with each claim standing on its own as a separate embodiment.

We claim:

1. A method of semiconductor processing comprising:
   forming undoped polysilicon on an oxide surface of a trench, the undoped polysilicon formed via depositing a disilane ($Si_2H_6$) precursor material on the oxide surface at a process temperature below 450° C. and sufficient to induce thermal decomposition of the disilane precursor material into the undoped polysilicon; and
   forming a boron-doped polysilicon on a surface of the undoped polysilicon within the trench at a substantially the same process temperature below 450° C. to prevent void formation within the trench, the doped polysilicon formed via depositing a silane ($SiH_4$) precursor material and a boron dopant material on the surface of the undoped polysilicon;
   wherein a nucleation time associated with forming the boron-doped polysilicon on the surface of the undoped polysilicon within the trench at the process temperature below 450° C. is less than two minutes.

2. The method of claim 1, wherein depositing the disilane precursor material on the oxide surface includes depositing the disilane precursor material on the surface of a trench having a width in a range of 20-30 nanometers and a depth of at least 50 nanometers.

3. The method of claim 1, wherein the method includes forming the undoped polysilicon by chemical vapor deposition at the process temperature and a pressure that induces nucleation at around 2 minutes.

4. The method of claim 3, wherein the method includes forming the boron-doped polysilicon by chemical vapor deposition over the formed undoped polysilicon at the process temperature and the pressure by inducing nucleation of the boron-doped polysilicon at around 1 minute.

5. The method of claim 4, wherein the method includes forming the boron-doped and undoped polysilicon with the process temperature and the pressure at levels selected to induce conformal deposition in a substantially amorphous configuration in order to reduce void formation in the trench.

6. The method of claim 1, wherein the method includes filling the trench with the undoped polysilicon and the boron-doped polysilicon to serve as a control gate in a non-volatile memory cell.

7. A method of semiconductor processing comprising:
   depositing a disilane ($Si_2H$) precursor material on a silicon dioxide ($SiO_2$) surface of a trench at a process temperature below 450° C. to form an undoped polysilicon seed material on the silicon dioxide surface of the trench via thermal decomposition of the disilane; and
   depositing a silane ($SiH_4$) precursor material and a boron-containing dopant on a surface of the undoped polysilicon at substantially the same process temperature below 450° C. to form a void-free boron-doped polysilicon within the trench;
   wherein a nucleation time associated with forming the void-free boron-doped polysilicon within the trench at the process temperature below 450° C. is less than two minutes.

8. The method of claim 7, wherein depositing the disilane precursor material includes depositing disilane ($Si_2H_6$) that undergoes thermal decomposition to the undoped polysilicon in a temperature range of 380-450° C.

9. The method of claim 7, wherein depositing the silane precursor material includes depositing silane ($SiH_4$) and the boron-containing dopant that undergo thermal decomposition to the boron-doped polysilicon in a temperature range of 380-450° C.

10. The method of claim 9, wherein forming the boron-doped polysilicon includes forming a P-type semiconductor structure in combination with the undoped polysilicon.

11. The method of claim 7, wherein the method of semiconductor processing includes reducing a nucleation time of the silane precursor material at multiple sites on the undoped polysilicon.

12. The method of claim 11, wherein reducing the nucleation time includes reducing a length of time for formation of a boron-doped polysilicon as compared to formation of the boron-doped polysilicon in the absence of the undoped polysilicon.

13. The method of claim 7, wherein the method of semiconductor processing includes utilizing chemical vapor deposition to partially fill an unfilled portion of the trench on the surface of a semiconductor structure with the undoped polysilicon to a substantially uniform thickness on walls and a bottom of the unfilled portion of the trench and to fill a remainder of the trench with the boron-doped polysilicon.

14. A method of semiconductor processing comprising:
   depositing a gaseous disilane ($Si_2H_6$) in a trench on a solid silicon dioxide ($SiO_2$) surface of the trench at a temperature below 450° C. that induces thermal decomposition of disilane into an undoped polysilicon to cover walls and a bottom of the solid $SiO_2$ surface of the trench;
   depositing a gaseous silane ($SiH_4$) and a gaseous boron-containing dopant on a surface of the undoped polysilicon at substantially the same temperature below 450° C.; and
   inducing nucleation of the gaseous silane ($SiH_4$) and the gaseous boron-containing dopant and accelerating conformal forming of a boron-doped polysilicon by the undoped polysilicon serving as a seed in order to reduce void formation in the trench;
   wherein a nucleation time associated with forming the boron-doped polysilicon within the trench at the temperature below 450° C. is less than two minutes.

15. The method of claim 14, wherein the method includes forming the undoped polysilicon on the walls and the bottom of the solid $SiO_2$ surface of the trench to a substantially uniform thickness in a range of 1-7 nanometers.

16. The method of claim 14, wherein depositing the silane and the boron-containing dopant includes inducing thermal decomposition thereof to form the boron-doped polysilicon in a temperature range of 380-450° C.

17. The method of claim 14, wherein the method includes utilizing chemical vapor deposition with a substantially stable temperature in a range of 380-450° C. and with a substantially stable pressure in a range of 0.2-0.5 Torr to induce a substantially amorphous configuration of the boron-doped polysilicon.

18. The method of claim 14, wherein the method includes adjusting flow rates of the gaseous silane and the gaseous boron-containing dopant during chemical vapor deposition such that the boron atom density in the boron-doped polysilicon is in a range of 0.1-1.0% per cubic centimeter of the boron-doped polysilicon.

* * * * *

UNITED STATES PATENT AND TRADEMARK OFFICE
CERTIFICATE OF CORRECTION

PATENT NO. : 7,943,463 B2
APPLICATION NO. : 12/417038
DATED : May 17, 2011
INVENTOR(S) : Anish Khandekar et al.

It is certified that error appears in the above-identified patent and that said Letters Patent is hereby corrected as shown below:

In column 19, line 51, in Claim 7, delete "$(Si_2H)$" and insert -- $(Si_2H_6)$ --, therefor.

Signed and Sealed this
Twelfth Day of July, 2011

David J. Kappos
*Director of the United States Patent and Trademark Office*